United States Patent
Yang

(10) Patent No.: US 9,837,454 B2
(45) Date of Patent: Dec. 5, 2017

(54) IMAGE SENSOR

(71) Applicant: SK hynix Inc., Gyeonggi-do (KR)

(72) Inventor: Yun-Hui Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/992,728

(22) Filed: Jan. 11, 2016

(65) Prior Publication Data

US 2017/0092671 A1    Mar. 30, 2017

(30) Foreign Application Priority Data

Sep. 25, 2015  (KR) .......................... 10-2015-0136120

(51) Int. Cl.
*H01L 27/146*  (2006.01)
*H04N 5/365*  (2011.01)
*H04N 5/3745*  (2011.01)

(52) U.S. Cl.
CPC .... *H01L 27/14605* (2013.01); *H01L 27/1462* (2013.01); *H01L 27/14621* (2013.01); *H01L 27/14625* (2013.01); *H01L 27/14645* (2013.01); *H04N 5/365* (2013.01); *H04N 5/37457* (2013.01)

(58) Field of Classification Search
CPC ......... H01L 27/14605; H01L 27/14625; H01L 27/14645; H01L 27/1462; H01L 27/14621
See application file for complete search history.

(56) References Cited

U.S. PATENT DOCUMENTS

| | | | | |
|---|---|---|---|---|
| 6,060,732 A | * | 5/2000 | Murakami | ........ H01L 27/14818 257/215 |
| 2009/0072281 A1 | | 3/2009 | Kim et al. | |
| 2009/0294811 A1 | * | 12/2009 | Rhodes | ............. H01L 27/14609 257/292 |
| 2015/0312461 A1 | * | 10/2015 | Kim | .................. H01L 27/14609 348/308 |

FOREIGN PATENT DOCUMENTS

| | | |
|---|---|---|
| KR | 100825810 | 4/2008 |
| KR | 101305608 | 9/2013 |

* cited by examiner

*Primary Examiner* — David Vu
(74) *Attorney, Agent, or Firm* — IP & T Group LLP

(57) ABSTRACT

Provided is an image sensor having improved performance. An image sensor in accordance with an embodiment of the present invention including a pixel array in which a plurality of pixels are two-dimensionally arranged, wherein each of the plurality of pixels may include: a photoelectric conversion element formed in a substrate; a transfer gate overlapping with a portion of the photoelectric conversion element and formed on the substrate; and a color filter over the photoelectric conversion element, wherein the plurality of pixels include two adjacent pixels which have the same color filter, and wherein one of the two adjacent pixels comprises an incident light control pattern.

20 Claims, 7 Drawing Sheets

IMAGE SENSOR

CROSS-REFERENCE TO RELATED APPLICATIONS

The present application claims priority of Korean Patent Application No. 10-2015-0136120, filed on Sep. 25, 2015, which is herein incorporated by reference in its entirety.

BACKGROUND

Exemplary embodiments of the present invention relate to a semiconductor device manufacturing technology, and more particularly, to an image sensor capable of preventing a noise.

An image sensor converts an optical image into an electrical signal. Recently, due to the development of the computer industry and the communication industry, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor having improved performance.

In an embodiment, an image sensor may include a pixel array in which a plurality of pixels is two-dimensionally arranged. Each of the plurality of pixels may include a photoelectric conversion element formed in a substrate; a transfer gate overlapping with a portion of the photoelectric conversion element and formed on the substrate; and a color filter over the photoelectric conversion element. The plurality of pixels may include two adjacent pixels which have the same color filter, and one of the two adjacent pixels may include an incident light control pattern.

The plurality of pixels includes two adjacent pixels which may be arranged in a column direction and may share one floating diffusion region. The two adjacent pixels having the same color filter may be located in a diagonal direction. One pixel of the two adjacent pixels may be different from the other pixel in a position where the photoelectric conversion element overlaps with the transfer gate. The incident light control pattern may have a ring shape and may be formed along an edge of the photoelectric conversion element. The incident light control pattern may be formed over the photoelectric conversion element and may have a flat plate shape, a slit shape, or a dot shape, wherein the flat plate shape may cover the photoelectric conversion element and wherein the dot shape may be arranged in a matrix structure.

Further, the image sensor in accordance with the embodiment may further include an antireflection layer interposed between the substrate and the incident light control pattern; and an interlayer dielectric layer formed on the substrate and covering the transfer gate. The antireflection layer may be formed on the substrate and covers the photoelectric conversion element, wherein the incident light control pattern may be formed on the antireflection layer, and wherein the antireflection layer and the incident light control pattern may be positioned in the interlayer dielectric layer.

The antireflection layer may be formed on the interlayer dielectric layer, and wherein the incident light control pattern may be formed on the antireflection layer. The antireflection layer may be formed on the substrate, covers the photoelectric conversion element, and may be positioned in the interlayer dielectric layer, and wherein the incident light control pattern may be formed on the interlayer dielectric layer.

In an embodiment, an image sensor may include a pixel array including a plurality of pixel groups, wherein each of the plurality of pixel groups includes a first pixel a second pixel, a third pixel, and a fourth pixel which are arranged in a 2×2 matrix structure and in two-dimensions. Each of the first to the fourth pixels may include a photoelectric conversion element formed in a substrate; a transfer gate overlapping with a portion of the photoelectric conversion element and formed on the substrate and a color filter formed over the photoelectric conversion element. The first to the third pixels may include different color filters from each other, wherein the fourth pixel may include the same color filter as the first pixel, and wherein any one of the first pixel and the fourth pixel may include a incident light control pattern.

The first pixel and the third pixel may be arranged in the same column as each other and may share a first floating diffusion region. The second pixel and the fourth pixel may be arranged in another same column as each other and may share a second floating diffusion region. The fourth pixel may be positioned in a diagonal direction from the first pixel. The first pixel and the fourth pixel may be different from each other in a position where the photoelectric conversion element overlaps with the transfer gate. The incident light control pattern may have a ring shape and may be formed along an edge of the photoelectric conversion element. The incident light control pattern may be formed over the photoelectric conversion element and may have a flat plate shape, a slit shape, or a dot shape, wherein the flat plate shape may cover the photoelectric conversion element, and wherein the dot shape may be arranged in a matrix structure.

Further, the image sensor in accordance with the embodiment may further include an antireflection layer interposed between the substrate and the incident light control pattern; and an interlayer dielectric layer formed on the substrate and covering the transfer gate. The antireflection layer may be formed on the substrate and covers the photoelectric conversion element, wherein the incident light control pattern may be formed on the antireflection layer, and wherein the antireflection layer and the incident light control pattern may be positioned in the interlayer dielectric layer. The antireflection layer may be formed on the interlayer dielectric layer, and wherein the incident light control pattern may be formed on the antireflection layer. The antireflection layer may be formed on the substrate, covers the photoelectric conversion element, and may be positioned in the interlayer dielectric layer, and wherein the incident light control pattern may be formed on the interlayer dielectric layer.

DETAILED DESCRIPTION

Figure 1:
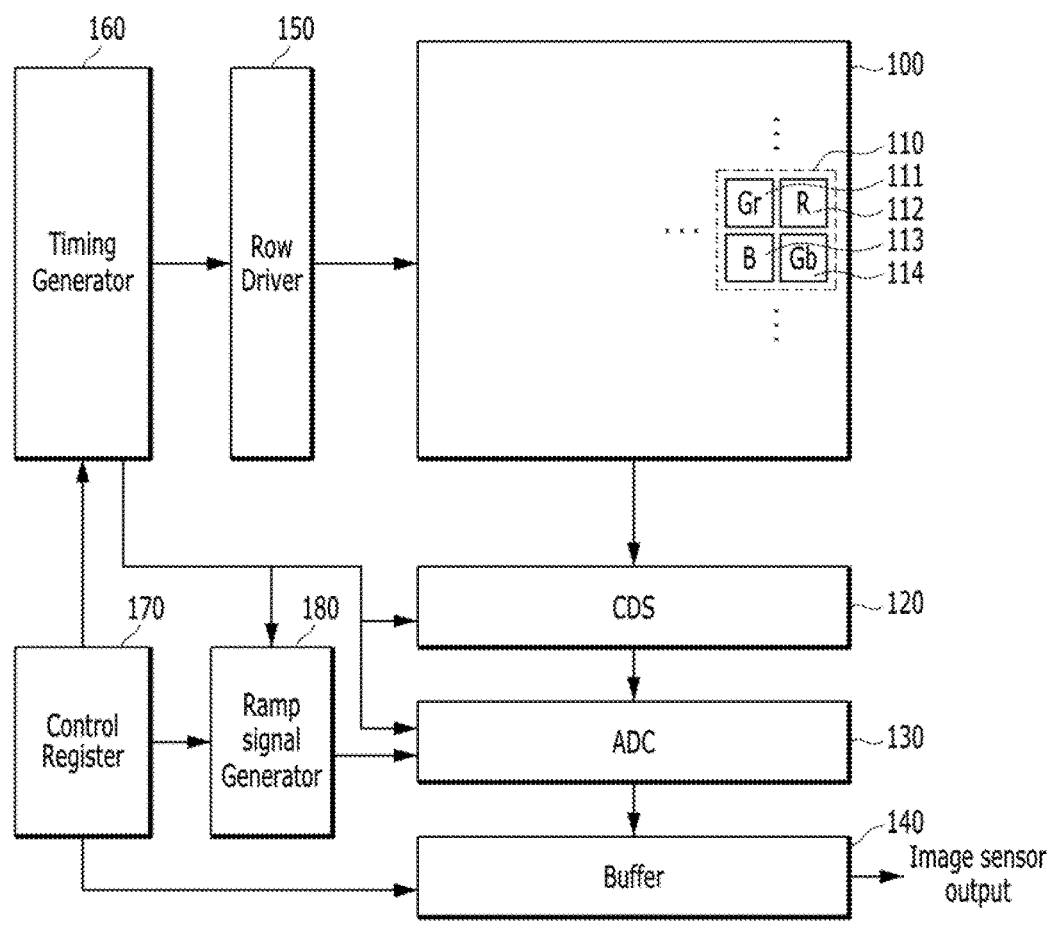
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The following embodiments of the present invention provide an image sensor having improved performance. Here, the image sensor having improved performance may mean an image sensor capable of preventing a noise. In this case, the noise may result from a difference in output signals generated by an image sensor having a shared pixel structure.

Specifically, as an image sensor becomes highly integrated, a physical size of each pixel is continuously decreased. Due to this, an image sensor having a shared pixel structure and sharing a pixel transistor disposed in each pixel is introduced to prevent deterioration of a fill factor and sensitivity of a photoelectric conversion element. The structure sharing a pixel transistor has a drawback in that a deviation of an incident light may occur according to an angle of the incident light due to asymmetry of a transistor disposed around the photoelectric conversion element, that is, a transfer transistor. Thus, a difference in an output signal of each pixel, that is, a pixel signal may occur. Particularly, a difference in a pixel signal occurring among pixels, which are adjacent to each other and have color filters of the same color as each other, results in a noise type of a maze effect through a post treatment, for example, a color interpolation process.

Therefore, the following embodiments of the present invention provide an image sensor capable of preventing a noise due to a difference in pixel signals in an image sensor having a shared pixel structure.

FIG. 1 is a block diagram schematically illustrating an image sensor in accordance with an embodiment of the present invention. As shown in FIG. 1, the image sensor of the embodiment may include a pixel array 100 in which a plurality of pixels are two-dimensionally arranged, a correlated double sampling (CDS) 120, an analog digital converter (ADC) 130, a buffer 140, a row driver 150, a timing generator 160, a control register 170, and a ramp signal generator 180.

The pixel array 100 may include a plurality of two-dimensionally arranged pixel groups 110 in which a plurality of pixels, for example, a first pixel 111, a second pixel 112, a third pixel 113 and a fourth pixel 114 are arranged in a 2×2 matrix structure. In this case, each of the plurality of pixel groups 100 may have a bayer pattern in which a red pixel R, green pixels Gr and Gb, and a blue pixel B are repeatedly arranged. For example, the first pixel 111 may be a first green pixel Gr, the second pixel 112 may be the red pixel R, the third pixel 113 may be the blue pixel B, and the fourth pixel 114 may be a second green pixel Gb.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the pixels may sense incident light and output an image reset signal and an image signal to the CDS unit 120 through a column line. The CDS unit 120 may perform sampling on the image reset signal and the image signal.

The ADC 130 may compare a ramp signal outputted from the ramp signal generator 180 with a sampling signal outputted from the CDS unit 120, and output a comparison signal. According to a dock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130, then sense and amplify the digital signals. Thus, the buffer 140 may include a memory (not illustrated) and a sense amplifier (not illustrated). The memory may store count values. The count values may represent signals outputted from the plurality of pixels. The sense amplifier may sense and amplify the count values outputted from the memory.

Figure 2:
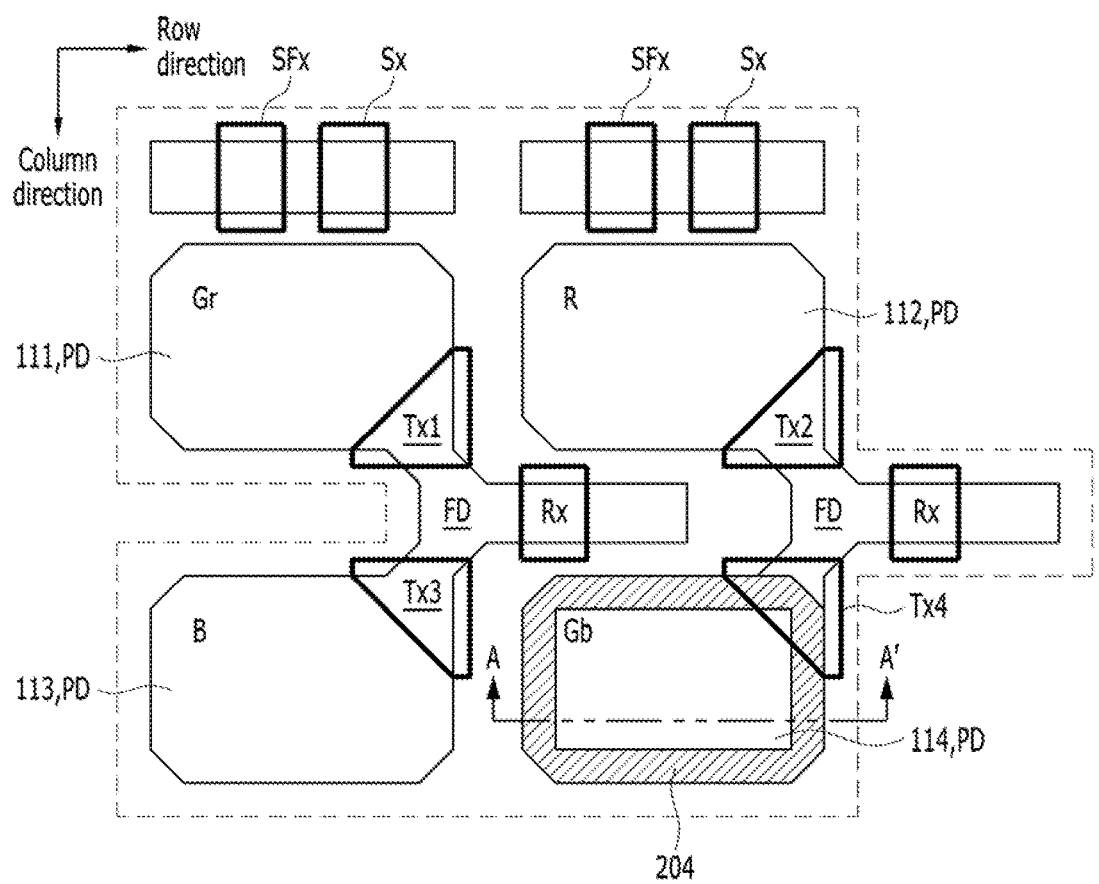
FIG. 2 is a plan view illustrating a pixel group of an image sensor in accordance with an embodiment of the present invention.
Figure 3A:
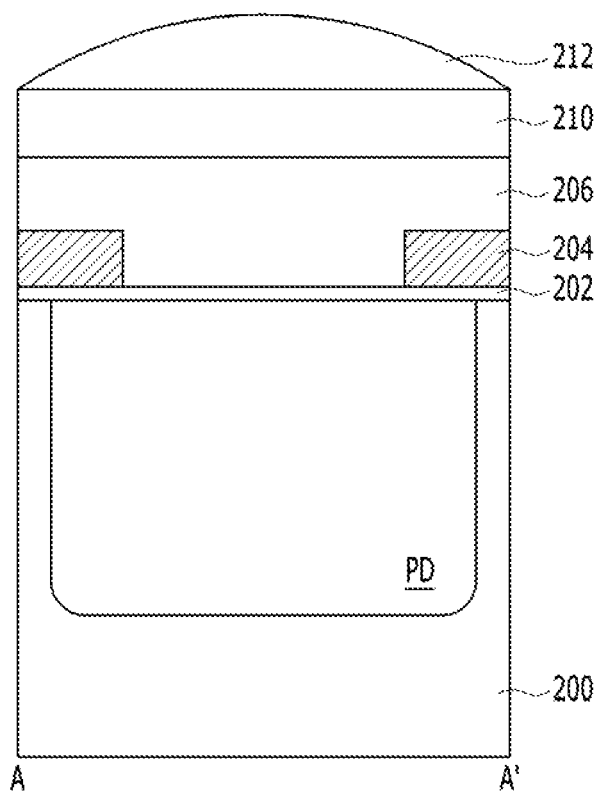
FIG. 3A is a cross-sectional view illustrating an image sensor in accordance with an embodiment of the present invention.
Figure 3B:
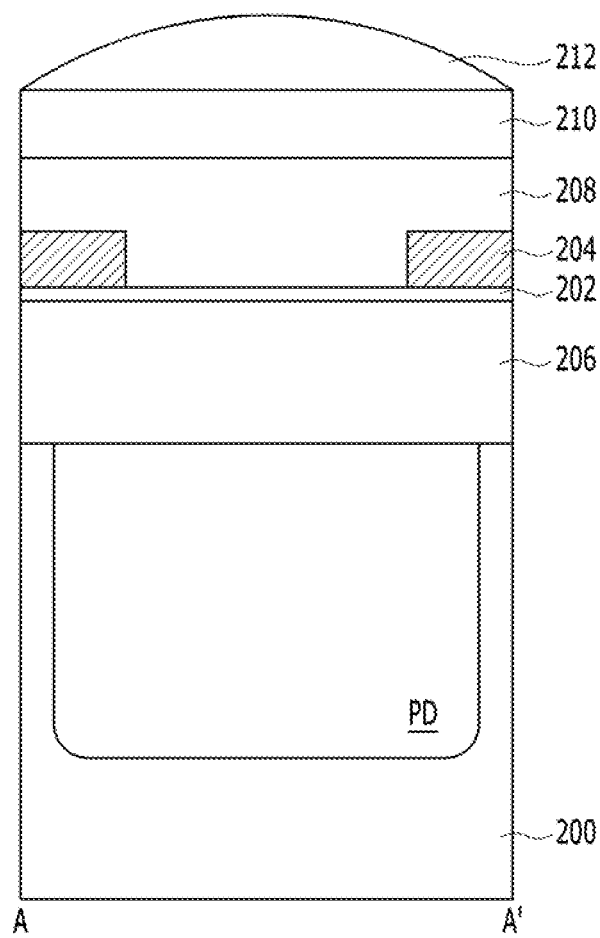
FIGS. 3B and 3C are cross-sectional views illustrating modifications of the image sensor shown in FIG. 3A.
Figure 3C:
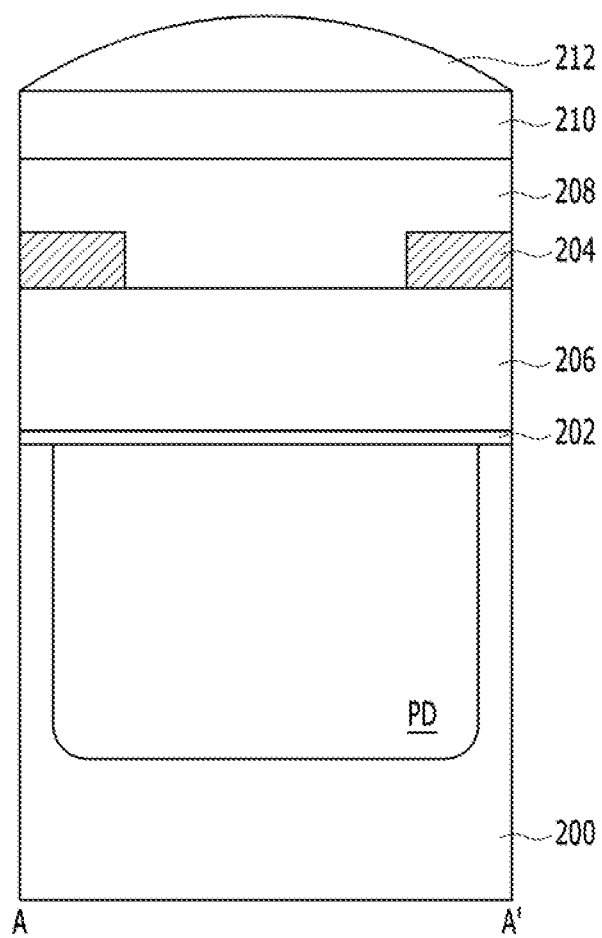
Figure 4A:
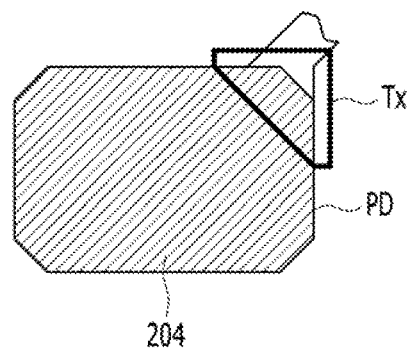
FIGS. 4A to 4C are plan views illustrating modifications of an incident light control pattern applicable to embodiments of the present invention.
Figure 4B:
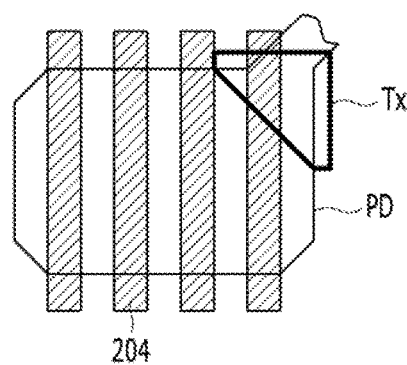
Figure 4C:
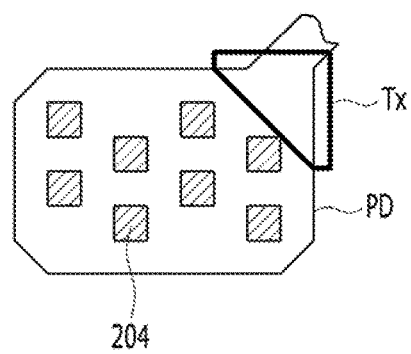

FIG. 2 is a plan view illustrating a pixel group of an image sensor in accordance with an embodiment of the present invention. FIG. 3A is a cross-sectional view illustrating an image sensor in accordance with an embodiment of the present invention and taken along the line A-A' shown in FIG. 2, and FIGS. 3B and 3C are modifications thereof. And, FIGS. 4A to 4B are plan views illustrating modifications of an incident light control pattern applicable to embodiments of the present invention.

As shown in drawings, the image sensor of the embodiment may include a pixel array 100 in which a plurality of pixels are two-dimensionally arranged, and each pixel in the pixel array 100 may include a photoelectric conversion element PD formed in a substrate 200, a transfer gate Tx overlapping with a portion of the photoelectric conversion element PD and formed on the substrate 200, and a color filter 210 formed over the photoelectric conversion element PD. Here, among the plurality of pixels, two adjacent pixels, for example, first and second pixels, may include the color filter 210 of the same color. One of the two adjacent pixels, for example, the first pixel, may include an incident light control pattern 204. In this case, the second pixel may be disposed in a diagonal direction from the first pixel.

For example, the pixel array 100 includes the plurality of two-dimensionally arranged pixel groups 110. The first to the fourth pixels 111-114 are arranged in a 2×2 matrix structure. The first pixel 111 to the third pixel 113 may include different color filters 210 from each other. That is the first pixel 111 may be a first green pixel Gr, the second pixel 112 may be a red pixel R and the third pixel 113 may be a blue pixel B. And, the fourth pixel 114 may include the same color filter 210 as any one of the first pixel 111 to the third pixel 113. For example, the fourth pixel 114 may be the second green pixel Gb having the same green color as the first pixel 111. Here, any one of the first pixel 111 and the fourth pixel 114 may include the incident light control pattern 204. Moreover, the first pixel 111 may be disposed in a diagonal direction of the fourth pixel 114.

Hereinbelow, the embodiments of the present invention will be described in detail with respect to drawings. Referring to FIG. 2, in each pixel group 110, two photoelectric conversion elements PD may be arranged in a column direction and share one floating diffusion region FD. For example, in a column direction, the first pixel 111 and the third pixel 113 may share one floating diffusion region FD, and the second pixel 112 and the fourth pixel 114 may share another floating diffusion region FD. In a row direction, a reset transistor including a reset gate Rx may be disposed on one side of the floating diffusion region FD.

In a column direction, a source follower transistor and a selection transistor may be arranged on one side of the two photoelectric conversion elements PD sharing one floating diffusion region FD. The source follower transistor includes a source follower gate SFx electrically coupled to the floating diffusion region FD. The selection transistor includes a selection gate Sx. For example, in a column direction, the source follower transistor and the selection transistor may be arranged over the first pixel 111 and the second pixel 112, respectively.

Two shared pixel blocks may be arranged in parallel to each other in a row direction. Each shared pixel block includes the two photoelectric conversion elements PD, the source follower transistor, and the selection transistor. The two photoelectric conversion elements PD share one floating diffusion region FD.

The transfer gate Tx overlapping with a portion of the photoelectric conversion element PD may be positioned on an edge of each of the first pixel 111 to the fourth pixel 114. A first transfer gate Tx1 of the first pixel 111 and a second transfer gate Tx2 of the second pixel 112 may be positioned on bottom right edges of the photoelectric conversion elements PD, respectively. The first transfer gate Tx1 and the second transfer gate Tx2 have the same shape as each other. A third transfer gate Tx3 of the third pixel 113 and a fourth transfer gate Tx4 of the fourth pixel 114 may be positioned on top right edges of the photoelectric conversion elements PD, respectively. The third transfer gate Tx3 and the fourth transfer gate Tx4 of the fourth pixel 114 have the same shape as each other. And, in a column direction, the first transfer gate Tx1 and the third transfer gate Tx3 may have symmetrical shapes to each other. The second transfer gate Tx2 and the fourth transfer gate Tx4 may have symmetrical shapes to each other.

The first transfer gate Tx1 of the first pixel 111 and the fourth transfer gate Tx4 of the fourth pixel 114 are disposed adjacently to each other in each pixel group 110, include the same color filters 210, and may have asymmetrical shapes to each other. Thus, upon exposure to the same incident light, the first pixel 111 and the fourth pixel 114 may generate difference signals from each other. In order to overcome a difference in pixel signals, in the image sensor in accordance with the embodiment, one of the first pixel 111 and the fourth pixel 114 may include the incident light control pattern 204. For example, a pixel signal of the fourth pixel 114 is formed larger than that of the first pixel 111 so that an amount of an incident light entering into the first pixel 111 is smaller than that in the fourth pixel 114.

The incident light control pattern 204 may control an amount of an incident light entering into the fourth pixel 114. The fourth pixel 114 is formed relatively larger than the first pixel 111 and having the same color filter 210. By restricting an amount of an incident light of the fourth pixel 114, light amounts entering into the first pixel 111 and the fourth pixel 114 can be controlled at the same level, and thus the pixel signals from the first pixel 111 and the fourth pixel 114 may be the same as each other. Thus, a noise can be prevented.

An amount of incident light may be reduced by decreasing the size of a light receiving area using the incident light control pattern 204, by absorbing a portion of the incident light using the light control pattern 204 to decrease an amount of a light, or by controlling transmittance of the incident light using the incident light control pattern 204. Accordingly, the incident light control pattern 204 may be formed of a material capable of reflecting incident light, a material capable of controlling transmittance of incident light, or a material capable of absorbing incident light. For example, the incident light control pattern 204 may be formed of various materials such as a metallic material, oxide, an insulating material, a carbon-containing material, etc.

To prevent amounts of incident light received by the first pixel 111 and the fourth pixel 114 from being different, the incident light control pattern 204 may have a ring-type shape and be formed along an edge of the photoelectric conversion element PD. Specifically, the incident light control pattern 204 having a ring-type shape may have a shape similar to an aperture of a camera. Moreover, the incident light control pattern 204 may have a flat plate shape covering a front surface of the photoelectric conversion element PD as shown in FIG. 4A, a slit shape as shown in FIG. 4B, and a dot shape arranged in a matrix structure as shown in FIG. 4B.

Referring to FIG. 3A, a cross-section of the fourth pixel 114 including the incident light control pattern 204 is described. A photoelectric conversion element PD is formed in a substrate 200, an antireflection layer 202 is formed on the substrate 200 to cover the photoelectric conversion element PD. An incident light control pattern 204 is formed on the antireflection layer 202. A first interlayer dielectric layer 206 is formed on a front surface of the substrate 200. A color filter 210 is formed on the first interlayer dielectric layer 206. A light condensing member 212 is formed on the color filter 210.

Since, in the above structure, the antireflection layer 202 may be formed on the photoelectric conversion element PD, antireflection efficiency may improve. In addition, since the incident light control pattern 204 is formed adjacently to the photoelectric conversion element PD, efficiency of the incident light control pattern 204 may be improved. In a vertical direction, the photoelectric conversion element PD and the incident light control pattern 204 directly contact each other so an incidental optical phenomenon such as diffraction may be prevented.

Referring to FIG. 3B, a photoelectric conversion element PD is formed in a substrate 200. A first interlayer dielectric layer 206 is formed on the substrate 200. An antireflection layer 202 is formed on the first interlayer dielectric layer 206. An incident light control pattern 204 is formed on the antireflection layer 202. A second interlayer dielectric layer 208 is formed on the first interlayer dielectric layer 206. A color filter 210 is formed on the second interlayer dielectric layer 208. A light condensing member 212 is formed on the color filter 210.

In the above structure, the antireflection layer 202 and the incident light control pattern 204 are formed on the first interlayer dielectric layer 206, and, thus process difficulties may be decreased. This is due to a fourth transfer gate Tx4 overlapping a portion of the photoelectric conversion element PD which is formed in the substrate 200 and in the first interlayer dielectric layer 206. That is, a layer which the fourth transfer gate Tx4 is formed and a layer in which the incident light control pattern 204 is formed are separated so that difficulty of a respective forming process may be decreased.

Referring to FIG. 3C, a photoelectric conversion element PD is formed in a substrate 200. An antireflection layer 202 is formed on the substrate 200 to cover the photoelectric conversion element PD. A first interlayer dielectric layer 206 is formed on the antireflection layer 202. An incident light control pattern 204 is formed on the first interlayer dielectric layer 206. A second interlayer dielectric layer 208 is formed on the first interlayer dielectric layer 206. A color filter 210 is formed on the second interlayer dielectric layer 208. A light condensing member 212 is formed on the color filter 210. In the above structure, the antireflection layer 202 is formed on the photoelectric conversion element PD, and thus antireflection efficiency may be maximized. Moreover, since the incident light control pattern 204 is formed on the first interlayer dielectric layer 206, process difficulties may be decreased. Further, it may prevent damage the antireflection layer 202 during a process of forming the incident light control pattern 204.

In FIGS. 3A to 3C, the substrate 200 may include a semiconductor substrate. The semiconductor substrate may be in a single crystal state and include a silicon-containing material. That is, substrate 200 may include a single crystal silicon-containing material. The photoelectric conversion element PD may include a photodiode.

In the photodiode, impurity regions, which have different conductivity from each other, are vertically stacked. For example, a P-type impurity region and an N-type impurity region are formed in the substrate 200 by an ion implantation process and are stacked.

The antireflection layer 202 may be a multi-layer. For example, a plurality of material layers having a different refractive index from each other may be staked to form the antireflection layer 202. In an embodiment, a first material layer and a second material layer are stacked alternately and repeatedly for a plurality of times. The light condensing member 212 may include a digital lens or a hemispherical lens.

As above, in the image sensor having a shared pixel structure, a noise due to a difference of incident light amounts and a difference in pixel signals may be prevented by the incident light control pattern 204.

The image sensor in accordance with an embodiment of the present invention may be used in various electronic devices or systems. Hereafter, the image sensor in accordance with an embodiment of the present invention which is applied to a camera be described with reference to FIG. 5.

Figure 5:
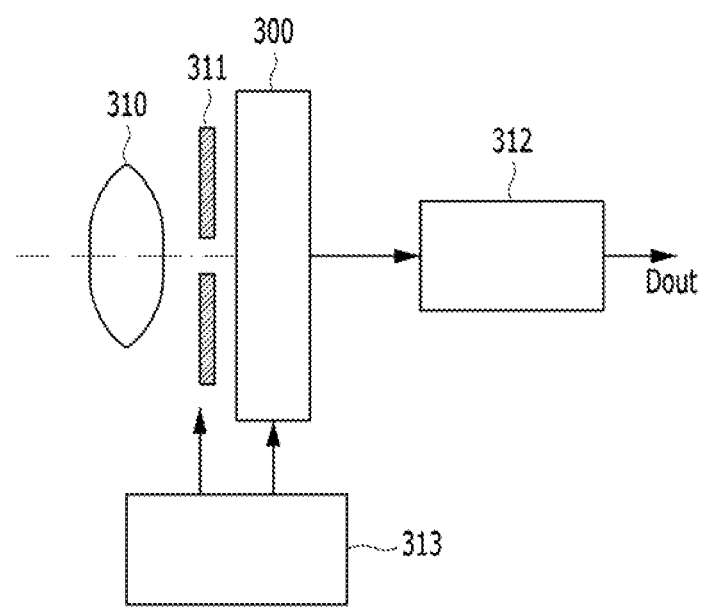
FIG. 5 is a diagram schematically illustrating an electronic device including an image sensor shown in FIG. 1.

FIG. 5 is a diagram schematically illustrating an electronic device including an image sensor shown in FIG. 1. Referring to FIG. 5, the electronic device including the image sensor in accordance with an embodiment of the present invention may be a camera capable of taking a still image or moving image. The electronic device may Include an optical system or optical lens 310, a shutter unit 311, a driving unit 313 for controlling/driving the image sensor 300 and the shutter unit 311, and a signal processing unit 312.

The optical system 310 may guide image light from an object to the pixel array 100 of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a pixel array in which a plurality of pixels are two-dimensionally arranged,
   wherein each of the plurality of pixels comprises:
   a photoelectric conversion element formed in a substrate;
   a transfer gate overlapping with a portion of the photoelectric conversion element and formed on the substrate; and
   a color filter over the photoelectric conversion element,
   wherein the plurality of pixels include two adjacent pixels which have the same color filter,
   wherein only one of the two adjacent pixels comprises an incident light control pattern for controlling an amount of an incident light entering into the plurality of pixels such that an amount difference of the incident light between the two adjacent pixels is prevented.

2. The image sensor of claim 1, wherein the plurality of pixels include two adjacent pixels which are arranged in a column direction and share one floating diffusion region.

3. The image sensor of claim 1, wherein the two adjacent pixels having the same color filter are located in a diagonal direction.

4. The image sensor of claim 1, wherein one pixel of the two adjacent pixels is different from the other pixel in a position where the photoelectric conversion element overlaps with the transfer gate.

5. The image sensor of claim 1, wherein the incident light control pattern has a ring shape and is Thinned along an edge of the photoelectric conversion element.

6. The image sensor of claim 1, wherein the incident light control pattern is formed over the photoelectric conversion element and has a flat plate shape, a slit shape, or a dot shape,
   wherein the flat plate shape covers the photoelectric conversion element, and
   wherein the dot shape is arranged in a matrix structure.

7. The image sensor of claim 1, further comprising:
   an antireflection layer interposed between the substrate and the incident light control pattern; and
   an interlayer dielectric layer formed on the substrate and covering the transfer gate.

8. The image sensor of claim 7, wherein the antireflection layer is formed on the substrate and covers the photoelectric conversion element, wherein the incident light control pattern is formed on the antireflection layer, and
   wherein the antireflection layer and the incident light control pattern are positioned in the interlayer dielectric layer.

9. The image sensor of claim 7, wherein the antireflection layer is formed on the interlayer dielectric layer, and wherein the incident light control pattern is forming on the antireflection layer.

10. The image sensor of claim 7, wherein the antireflection layer is formed on the substrate, covers the photoelectric conversion element, and is positioned in the interlayer dielectric layer, and
wherein the incident light control pattern is formed on the interlayer dielectric layer.

11. An image sensor comprising:
a pixel array including a plurality of pixel groups,
wherein each of the plurality of pixel groups includes a first pixel, a second pixel, a third pixel, and a fourth pixel which are arranged in a 2×2 matrix structure and in two-dimensions,
wherein each of the first to the fourth pixels comprises:
a photoelectric conversion element formed in a substrate;
a transfer gate overlapping with a portion of the photoelectric conversion element and formed on the substrate; and
a color filter formed over the photoelectric conversion element,
wherein the first to the third pixels comprise different color filters from each other,
wherein the fourth pixel comprises the same color filter as the first pixel, and
wherein only one of the first pixel and the fourth pixel comprises an incident light control pattern for controlling an amount of an incident light entering into one of the first to the fourth pixels such that an amount difference of the incident light between the first pixel and the fourth pixel is prevented.

12. The image sensor of claim 11, wherein the first pixel and the third pixel are arranged in the same column as each other and share a first floating diffusion region, and
wherein the second pixel and the fourth pixel are arranged in another same column as each other and share a second floating diffusion region.

13. The image sensor of claim 11, wherein the fourth pixel is positioned in a diagonal direction from the first pixel.

14. The image sensor of claim 11, wherein the first pixel and the fourth pixel are different from each other in a position where the photoelectric conversion element overlaps with the transfer gate.

15. The image sensor of claim 11, wherein the incident light control pattern has a ring shape and is formed along an edge of the photoelectric conversion element.

16. The image sensor of claim 11, wherein the incident light control pattern is formed over the photoelectric conversion element and has a flat plate shape, a slit shape, or a dot shape,
wherein the flat plate shape covers the photoelectric conversion element, and
wherein the dot shape is arranged in a matrix structure.

17. The image sensor of claim 11, further comprising:
an antireflection layer interposed between the substrate and the incident light control pattern; and
an interlayer dielectric layer formed on the substrate and covering the transfer gate.

18. The image sensor of claim 17, wherein the antireflection layer is formed on the substrate and covers the photoelectric conversion element,
wherein the incident light control pattern is formed on the antireflection layer, and
wherein the antireflection layer and the incident light control pattern are positioned in the interlayer dielectric layer.

19. The image sensor of claim 17, wherein the antireflection layer is formed on the interlayer dielectric layer, and
wherein the incident light control pattern is formed on the antireflection layer.

20. The image sensor of claim 17, wherein the antireflection layer is formed on the substrate, covers the photoelectric conversion element, and is positioned in the interlayer dielectric layer, and
wherein the incident light control pattern is formed on the interlayer dielectric layer.

* * * * *